(12) United States Patent
Xiao et al.

(10) Patent No.: US 11,690,204 B2
(45) Date of Patent: Jun. 27, 2023

(54) HEAT DISSIPATION MODULE, DISPLAY DEVICE AND ASSEMBLING METHOD OF DISPLAY DEVICE

(71) Applicants: Chengdu BOE Optoelectronics Technology Co., Ltd., Chengdu (CN); BOE Technology Group Co., Ltd., Beijing (CN)

(72) Inventors: Feng Xiao, Beijing (CN); Hongqiang Luo, Beijing (CN); Lixiang Yi, Beijing (CN); Xun Yao, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 156 days.

(21) Appl. No.: 17/414,617

(22) PCT Filed: Sep. 7, 2020

(86) PCT No.: PCT/CN2020/113838
§ 371 (c)(1),
(2) Date: Jun. 16, 2021

(87) PCT Pub. No.: WO2022/047801
PCT Pub. Date: Mar. 10, 2022

(65) Prior Publication Data
US 2022/0312651 A1    Sep. 29, 2022

(51) Int. Cl.
*H05K 7/20* (2006.01)
*G02F 1/1333* (2006.01)
(Continued)

(52) U.S. Cl.
CPC ... *H05K 7/20963* (2013.01); *G02F 1/133385* (2013.01); *G06F 1/203* (2013.01); *H05K 7/20472* (2013.01); *H10K 50/87* (2023.02)

(58) Field of Classification Search
CPC .......... H05K 7/20472; H05K 7/20481; H05K 7/20963; G06F 1/203; H01L 51/529; G02F 1/133385
See application file for complete search history.

(56) References Cited

U.S. PATENT DOCUMENTS

| | | | |
|---|---|---|---|
| 2022/0058990 A1* | 2/2022 | Yoo | H01L 51/56 |
| 2022/0201905 A1* | 6/2022 | Chen | H05K 7/20963 |
| 2022/0328576 A1* | 10/2022 | Huang | H01L 51/529 |

FOREIGN PATENT DOCUMENTS

| | | | | |
|---|---|---|---|---|
| CN | 103415179 A | | 11/2013 | |
| CN | 109461374 A | * | 3/2019 | G09F 9/00 |

(Continued)

*Primary Examiner* — Zachary Pape
(74) *Attorney, Agent, or Firm* — ArentFox Schiff LLP; Michael Fainberg (57) ABSTRACT

The present disclosure provides a heat dissipation module, a display device and an assembling method of the display device. In order to avoid the second windowing area from forming a sealed space during the defoaming treatment, an exhaust passage is formed between the second windowing area B and an edge of a heat dissipation film, and hot air formed in the second windowing area in a defoaming technology can be effectively released to the outside of the heat dissipation module through the exhaust passage, so that defects of the second windowing area can be effectively overcome, and increasing the attachment yield is facilitated.

17 Claims, 11 Drawing Sheets

(51) Int. Cl.
*G06F 1/20* (2006.01)
*H10K 50/87* (2023.01)

(56) References Cited

FOREIGN PATENT DOCUMENTS

| | | |
|---|---|---|
| CN | 110263734 A | 9/2019 |
| CN | 210134053 U | 3/2020 |
| CN | 111292616 A | 6/2020 |
| CN | 211238260 U | 8/2020 |
| JP | 2008158291 A | 7/2008 |

* cited by examiner

HEAT DISSIPATION MODULE, DISPLAY DEVICE AND ASSEMBLING METHOD OF DISPLAY DEVICE

CROSS REFERENCES TO RELATED APPLICATIONS

The present disclosure is a US National Stage of International Application No. PCT/CN2020/113838, filed on Sep. 7, 2020, the contents of which are entirely incorporated herein by reference.

FIELD

The present disclosure relates to the technical field of displaying, in particular to a heat dissipation module, a display device and an assembling method of the display device.

BACKGROUND

With high-speed development of smart phones, phones not only need to be beautiful in appearance, but also need to bring a better visual experience to users. All manufacturers start to increase the screen-to-body ratio of the smart phones, which makes full screens become a new competition point for the competition of smart phones. With the development of full screens, improvement requirements for performance and functions also increase every day, and under-screen fingerprints and under-screen cameras can bring visual striking and impact on use experience to a certain extent without influencing the high screen-to-body ratio.

SUMMARY

The embodiments of the present disclosure provide a heat dissipation module, including:
a heat dissipation film including grid glue, foam and a metal film which are arranged in a stacked manner,
a first release film located on one side, facing away from the foam, of the grid glue;
a second release film located on one side, facing away from the foam, of the metal film, wherein the heat dissipation film and the second release film are provided with a first windowing area and a second windowing area which penetrate through a thickness direction, and an exhaust passage is arranged between the second windowing area and an edge of the heat dissipation film;
a first protective film located on one side, facing away from the heat dissipation film, of the second release film, and covering the first windowing area; and
a second protective film located on one side, facing away from the heat dissipation film, of the second release film, and covering the second windowing area and the exhaust passage, wherein the first protective film and the second protective film are independently arranged.

In a possible implementation mode, in the heat dissipation module according to the embodiments of the present disclosure, the exhaust passage is an open slot or a cut-off seam between the second windowing area and the edge of the heat dissipation film.

In a possible implementation mode, in the heat dissipation module according to the embodiments of the present disclosure, the exhaust passage is located between the second windowing area and the edge of a nearest heat dissipation film, and an orthogonal projection of the exhaust passage on the heat dissipation film is a straight line.

In a possible implementation mode, in the heat dissipation module according to the embodiments of the present disclosure, the exhaust passage penetrates through the second release film.

In a possible implementation mode, in the heat dissipation module according to the embodiments of the present disclosure, the exhaust passage penetrates through the metal film of the heat dissipation film.

In a possible implementation mode, in the heat dissipation module according to the embodiments of the present disclosure, the exhaust passage penetrates through the heat dissipation film.

In a possible implementation mode, in the heat dissipation module according to the embodiments of the present disclosure, a width of the exhaust passage in a direction perpendicular to an extending direction is less than 2 mm and greater than or equal to 0 mm.

In another aspect, the embodiments of the present disclosure further provide a display device including:
a display panel including a first light-transmitting area and a second light-transmitting area which are arranged on a display area;
a heat dissipation film, wherein the heat dissipation film includes grid glue, foam and a metal film which are sequentially arranged on a back surface of the display panel in a stacked manner, a first windowing area penetrating through a thickness direction in the first light-transmitting area, a second windowing area penetrating through the thickness direction in the second light-transmitting area, and an exhaust passage between the second windowing area and an edge of the heat dissipation film;
a first attachment module located on the back surface of the display panel and fixed to the first light-transmitting area through the first windowing area; and
a second attachment module located on the back surface of the display panel and fixed to the second light-transmitting area through the second windowing area.

In a possible implementation mode, in the display device according to the embodiments of the present disclosure, the exhaust passage is an open slot or a cut-off seam between the second windowing area and the edge of the heat dissipation film.

In a possible implementation mode, in the display device according to the embodiments of the present disclosure, the exhaust passage is located between the second windowing area and the edge of a nearest heat dissipation film, and an orthogonal projection of the exhaust passage on the heat dissipation film is a straight line.

In a possible implementation mode, in the display device according to the embodiments of the present disclosure, the exhaust passage penetrates through the metal film of the heat dissipation film.

In a possible implementation mode, in the display device according to the embodiments of the present disclosure, the exhaust passage penetrates through the heat dissipation film.

In a possible implementation mode, in the display device according to the embodiments of the present disclosure, a width of the exhaust passage in a direction perpendicular to an extending direction is less than 2 mm and greater than or equal to 0 mm.

In a possible implementation mode, in the display device according to the embodiments of the present disclosure, the first attachment module is a fingerprint recognition module, and the second attachment module is a camera module.

In a possible implementation mode, in the display device according to the embodiments of the present disclosure, the display panel is an organic light emitting diode (OLED) display panel.

In another aspect, the embodiments of the present disclosure further provide an assembling method of the display device, and the assembling method includes:

providing a display panel, wherein the display panel has a first light-transmitting area and a second light-transmitting area on a display area;

providing the above-mentioned heat dissipation module according to the embodiments of the present disclosure;

after removing the first release film of the heat dissipation module, attaching the grid glue of the heat dissipation film to a back surface of the display panel;

after removing the first protective film of the heat dissipation module, fixing a first attachment module to the first windowing area;

after fixing the first attachment module, performing defoaming treatment, and exhausting, by an exhaust passage, gas pressure generated in the defoaming treatment in the second windowing area; and after removing the second protective film and the second release film of the heat dissipation module, fixing a second attachment module to the second windowing area.

In a possible implementation mode, in the assembling method according to the embodiments of the present disclosure, the first attachment module is a fingerprint recognition module, and the second attachment module is a camera module.

DETAILED DESCRIPTION OF THE EMBODIMENTS

At present, in a full-screen display device, a fingerprint recognition module and a camera module are both external modules attached under a screen of a display panel and need an attachment area to be reserved under the screen of the display panel, except that the fingerprint recognition module needs to be fully attached to the screen of the display panel in a fingerprint module factory, while the camera module can be assembled by a complete machine module factory. A heat dissipation film (spatial cooling film, SCF) composed of multiple layers of structures is applied to the back surface of the display panel in a module manufacturing process, and in order to attach the fingerprint recognition module and the camera module, a windowing design needs to be performed on an attachment area corresponding to the heat dissipation film. The windowing size is generally avoided according to attachment and a cutting tolerance. In order to prevent the heat dissipation film from being influenced by dirty foreign matters or strong light and the like in windowing areas during a period from the time of completion of manufacturing display panel to the time before the attachment of the fingerprint recognition module or the camera module, protective films will generally cover the windowing areas for shielding.

Because the fingerprint recognition module is in a full-attachment manner, attachment bubbles may influence fingerprint imaging, and a defoaming process must be performed. In other windowing areas without attachment of the heat dissipation film, such as a windowing area corresponding to the camera module, the windowing area is covered by a protective film to form a closed environment, resulting in the problems that a bulge dent or optical mura and the like would occur in the closed environment due to thermal expansion and cold contraction of local closed gas when the fingerprint recognition module is subjected to an attachment and defoaming process.

For the above problems, the embodiments of the present disclosure provide a heat dissipation module, a display device and an assembling method of the display device. In order to enable the purposes, the technical schemes and the advantages of the present disclosure to be clearer, specific implementation modes of the heat dissipation module, the display device and the assembling method of the display device according to the embodiments of the present disclosure are described in detail below in combination with the accompanying drawings. It should be understood that the preferred embodiments described below are for the purpose of illustrating and explaining the present disclosure only, and are not intended to limit the present disclosure. The embodiments and features of the embodiments in the present application can be combined with each other under the condition of no conflict.

The shapes and the sizes of various components in the drawings do not reflect a true scale and are intended to merely illustrate the contents of the present disclosure.

The heat dissipation module according to the embodiments of the present disclosure, as shown in FIGS. 1-8, includes:

a heat dissipation film 1 including grid glue 11, foam 12 and a metal film 13 which are arranged in a stacked manner, a first release film 2 located on one side, facing away from the foam 12, of the grid glue 11;

a second release film 3 located on one side, facing away from the foam 12, of the metal film 13, wherein the heat dissipation film 1 and the second release film 3 are provided with a first windowing area A and a second windowing area B which penetrate through a thickness direction, and an exhaust passage C is arranged between the second windowing area B and an edge of the heat dissipation film 1;

a first protective film 4 located on one side, facing away from the heat dissipation film 1, of the second release film 3, and covering the first windowing area A; and a second protective film 5 located on one side, facing away from the heat dissipation film 1, of the second release film 3, and covering the second windowing area B and the exhaust passage C, wherein the first protective film 4 and the second protective film 5 are independently arranged.

Figure 1:
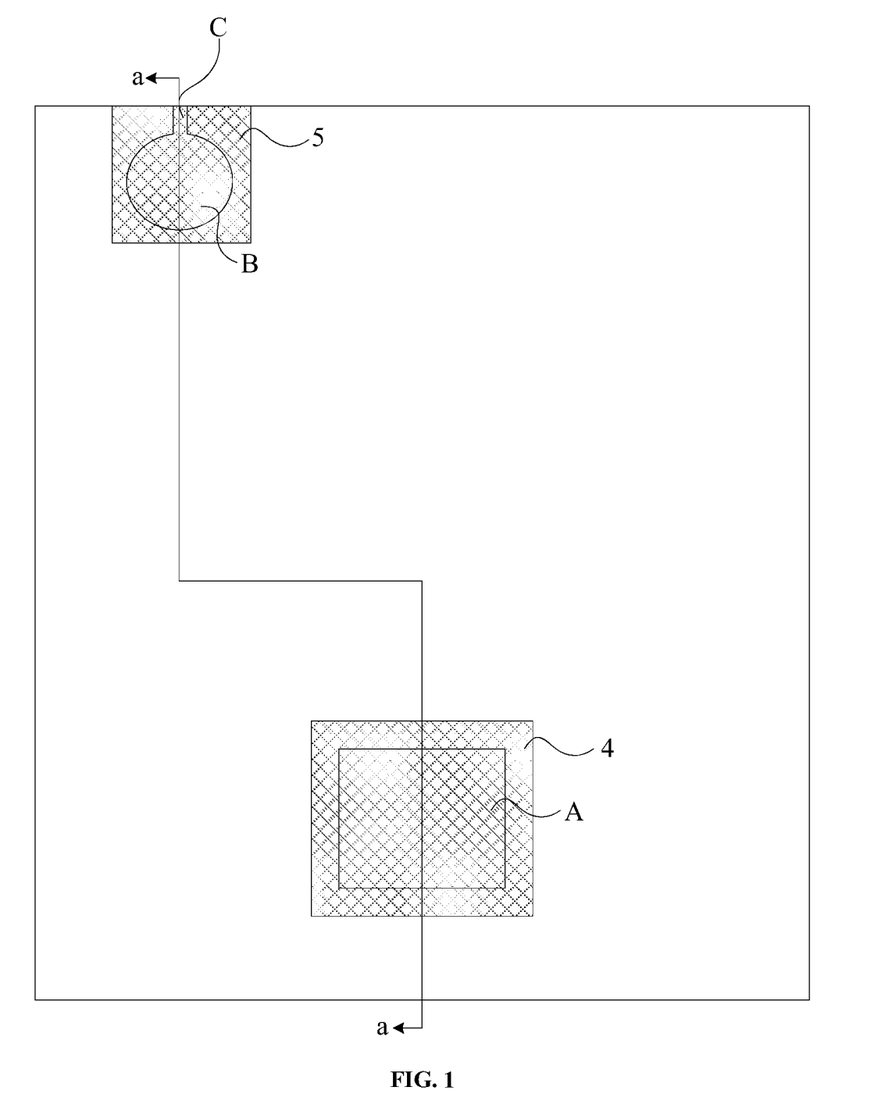
FIG. 1 is a structural schematic diagram of a heat dissipation module according to the embodiments of the present disclosure.

Specifically, in the heat dissipation module according to the embodiments of the present disclosure, the first release film 2, as a surface protective layer, is peeled off when the heat dissipation film 1 is attached to the back surface of the display panel, so that the grid glue 11 fixes the foam 12 to the back surface of the display panel. The foam 12, as a buffer layer, is used for relieving impact of an external force on the display panel during complete machine assembling. The metal film 13, as a main heat dissipation layer, is used for heat dissipation, and is generally made of copper foil. The second release film 3 is attached to the surface of the metal film 13, and is used for protecting the metal film 13 and preventing the surface of the metal film 13 from being polluted before the complete machine assembling to further influence the complete machine assembling, and the second release film 13 is generally torn off during the complete machine assembling. The heat dissipation film 1 can further include other film layers, such as graphite, without limitation herein.

Specifically, the first windowing area A and the second windowing area B which penetrate through the heat dissipation film 1 and the second release film 3 are arranged to attach corresponding under-screen modules to the back surface of the display panel through different windowing areas. The number of the windowing areas usually corresponds to the number of the under-screen modules which need to be attached. Generally, one windowing area corresponds to one under-screen module. Corresponding windowing areas can be arranged in the heat dissipation module specifically according to the positions and the number of the under-screen modules which need to be attached to the back surface of the display panel. A difference between the first windowing area A and the second windowing area B lies in the attaching order. When the display device is assembled, an under-screen module is attached to the first windowing area A firstly, and then an under-screen module is attached to the second windowing area B. Specifically, the first windowing area A can correspond to the fingerprint recognition module which is attached first, and the second windowing area B can correspond to the camera module which is attached later.

Specifically, the first protective film 4 covering the first windowing area A and the second protective film 5 covering the second windowing area B are arranged in order to avoid the first windowing area A and the second windowing area B from being exposed to be influenced by dirty foreign matters or strong light and the like, during a period from the time of completion of the manufacturing of the display panel to the time before the fingerprint recognition module or the camera module is attached. The first protective film 4 and the second protective film 5 are independent from each other, so that only the first protective film 4 can be torn off when the first windowing area A is attached, and the second protective film 5 is maintained to shield and protect the second windowing area B. The first protective film 4 and the second protective film 5 are generally made of shading materials, such as black adhesive tapes. In order to achieve a better covering and shielding effect, save materials and reduce the cost, the first protective film 4 is generally slightly larger than an area of the first windowing area A, and the second protective film 5 is generally slightly larger than an area of the second windowing area B. Moreover, in order to avoid the exhaust passage C from being exposed from one side of the second release film 3 to be influenced by the dirty foreign matters or strong light and the like, the second protective film 5 can also cover the exhaust passage C, as shown in FIG. 1.

Because full attachment and defoaming treatment inevitably need to be performed when the fingerprint recognition module is attached to the first windowing area A, and the defoaming treatment needs a certain temperature and pressure, if the second windowing area B is a closed space, thermal expansion and cold contraction of local air may occur, resulting in possible extrusion of the second protective film 5 on the surface into a corresponding position of the display panel, so as to cause breakage or optical stripes and other problems of the display panel. In order to avoid the second windowing area B from forming a sealed space during the defoaming treatment, the exhaust passage C is arranged between the second windowing area B and an edge of the heat dissipation film 1, and hot air formed in the second windowing area B in a defoaming technology can be effectively released to the outside of the heat dissipation module through the exhaust passage C, so that defects of the second windowing area B can be effectively overcome, and increasing the attachment yield is facilitated.

Specifically, when the heat dissipation module according to the embodiments of the present disclosure is manufactured, after the grid glue 11, the foam 12 and the metal film 13 are sequentially attached to complete the manufacturing of the heat dissipation film 1, the first release film 2 can be attached to one side of the grid glue 11 to protect the grid glue 11, and the second release film 3 can be attached to one side of the metal film 13 to protect the metal film 13. Then, the first windowing area A and the second windowing area B which penetrate through the heat dissipation film 1 and the second release film 3 are formed on one side of the second release film 3 in a cutting manner and the like, and the exhaust passage C can be formed at the same time.

Figure 2:
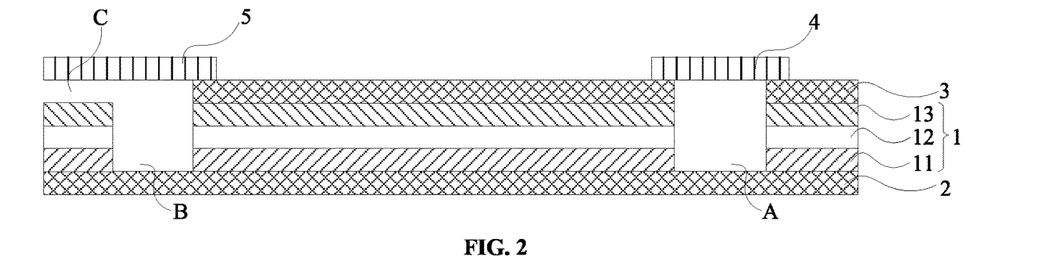
FIG. 2 is a cross-sectional structural schematic diagram along aa in FIG. 1.

Optionally, in the heat dissipation module according to the embodiments of the present disclosure, based on the manufacturing manner of the heat dissipation module, when the exhaust passage C is manufactured on one side of the second release film 3, as shown in FIG. 2, the exhaust passage C can only penetrate through the second release film 3, i.e., the exhaust passage C is formed only on the second release film 3, and areas of the respective film layers of the heat dissipation film 1 under the exhaust passage C remain intact and are not cut.

Figure 3:
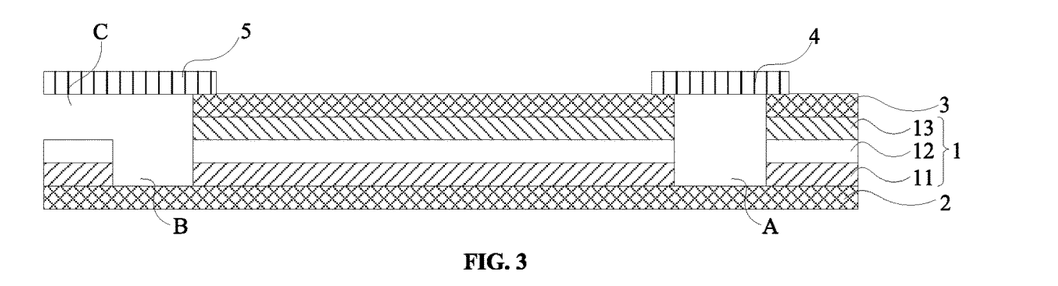
FIG. 3 is another cross-sectional structural schematic diagram along aa in FIG. 1.

Further, optionally, in the heat dissipation module according to the embodiments of the present disclosure, based on the manufacturing manner of the heat dissipation module, when the exhaust passage C is manufactured on one side of the second release film 3, as shown in FIG. 3, the exhaust passage C can penetrate through the metal film 13 of the heat dissipation film 1, i.e., the exhaust passage C is formed only on the second release film 3 and the metal film 13, and areas of the grid glue 11 and the foam 12 of the heat dissipation film 1 under the exhaust passage C remain intact and are not cut.

Figure 4:
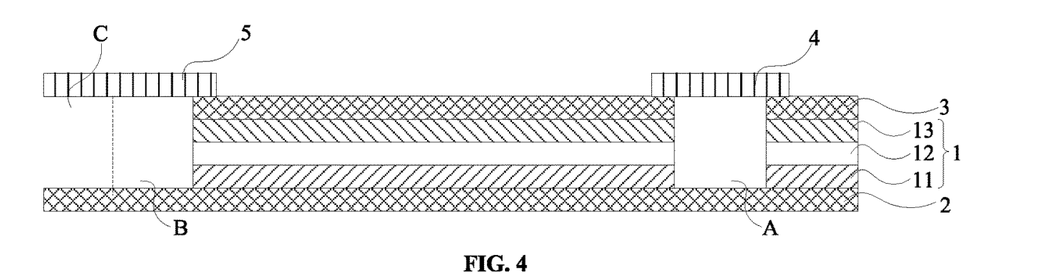
FIG. 4 is another cross-sectional structural schematic diagram along aa in FIG. 1.

Further, optionally, in the heat dissipation module according to the embodiments of the present disclosure, based on the manufacturing manner of the heat dissipation module, when the exhaust passage C is manufactured on one side of the second release film 3, as shown in FIG. 4, the exhaust passage C can penetrate through the heat dissipation film 1, i.e., the exhaust passage C is formed on the second release film 3 and the heat dissipation film 1 at the same time, i.e., areas of the respective film layers of the heat dissipation film 1 in the exhaust passage C are all cut, and only the first release film 2 remains intact.

Figure 5:
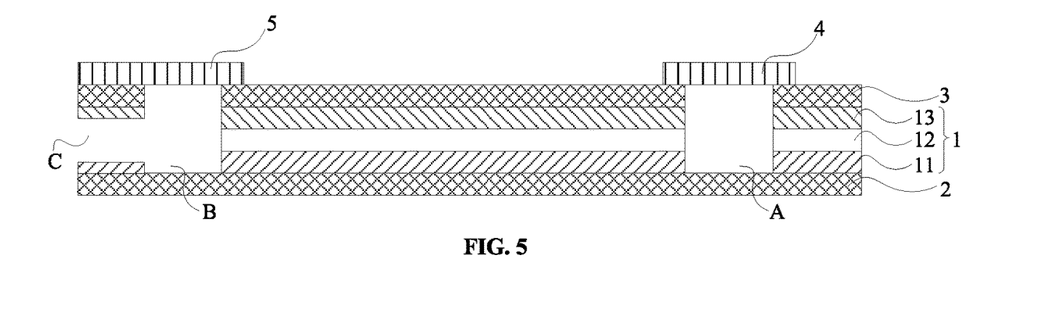
FIG. 5 is another cross-sectional structural schematic diagram along aa in FIG. 1.

Optionally, in the heat dissipation module according to the embodiments of the present disclosure, based on the manufacturing manner of the heat dissipation module, the exhaust passage C can also be manufactured on one side of a side edge of the heat dissipation module. As shown in FIG. 5, a passage leading to the second windowing area B can be formed from a side edge of the heat dissipation module. For example, as shown in FIG. 5, the passage can get through the film layer where the foam 12 is located to the second windowing area B, and the passage can also get through other adjacent film layers according to the aperture of the passage, without limitation herein.

Specifically, the larger and deeper the aperture of the passage of the exhaust passage C is, the better the exhaust effect is, but the more easily the second windowing area B is influenced by the dirty foreign matters or the strong light and the like through the exhaust passage C, so that when the exhaust passage C is manufactured, film layers and the width occupied by the exhaust passage C can be designed as required to meet the requirements.

Figure 6:
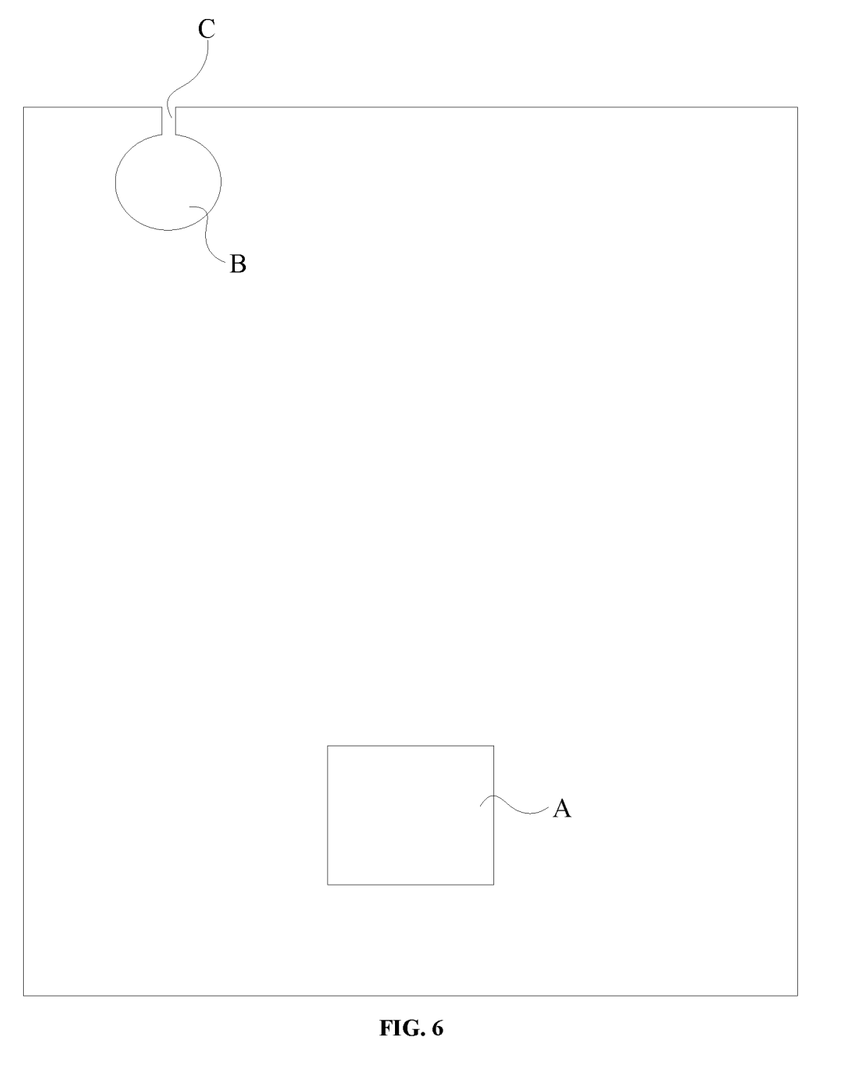
FIG. 6 is another top-view structural schematic diagram of the heat dissipation module according to the embodiments of the present disclosure.

Optionally, in the heat dissipation module according to the embodiments of the present disclosure, as shown in FIG. 6, the exhaust passage C can be an open slot between the second windowing area B and the edge of the heat dissipation film 1, i.e., a trench having a certain width is formed in an orthogonal projection of the heat dissipation film 1 in the cutting manner or the like. Specifically, the width of the exhaust passage C in the direction perpendicular to the extending direction of the exhaust passage C, i.e., the slot width, is generally greater than 0 mm and less than 2 mm.

Figure 7:
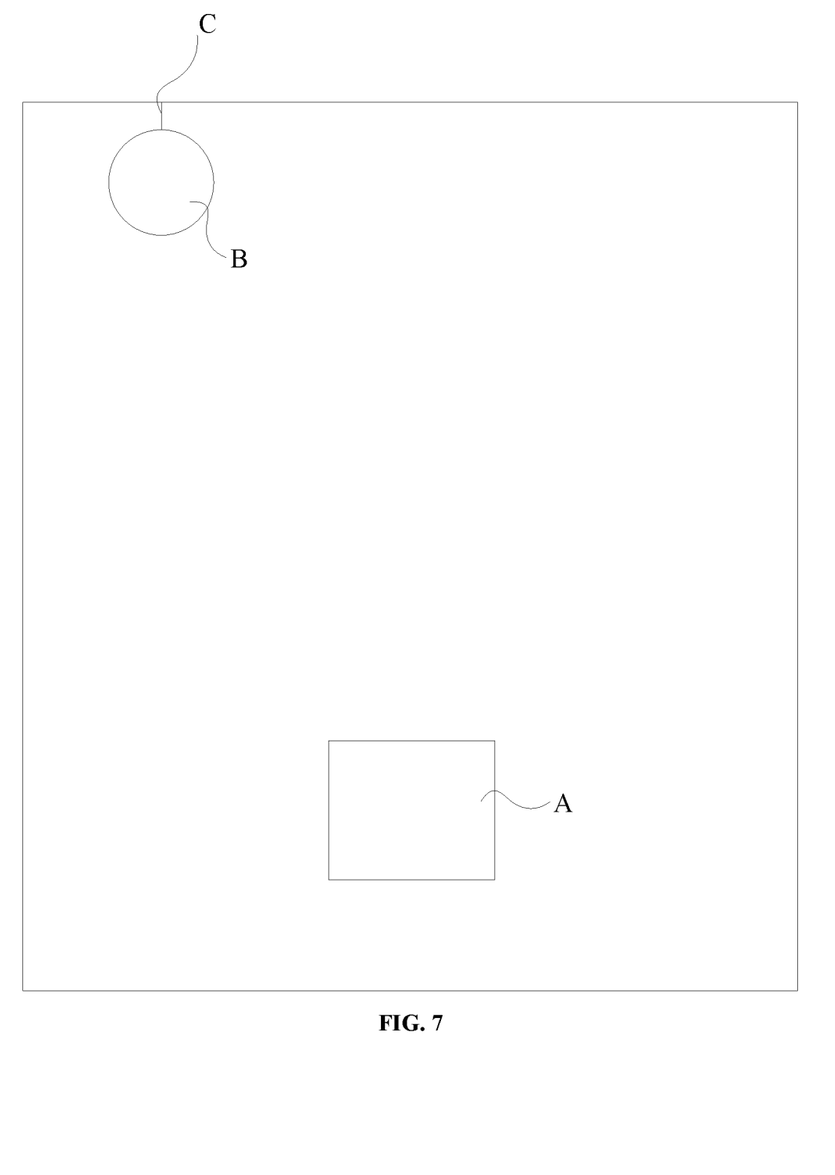
FIG. 7 is another top-view structural schematic diagram of the heat dissipation module according to the embodiments of the present disclosure.
Figure 8:
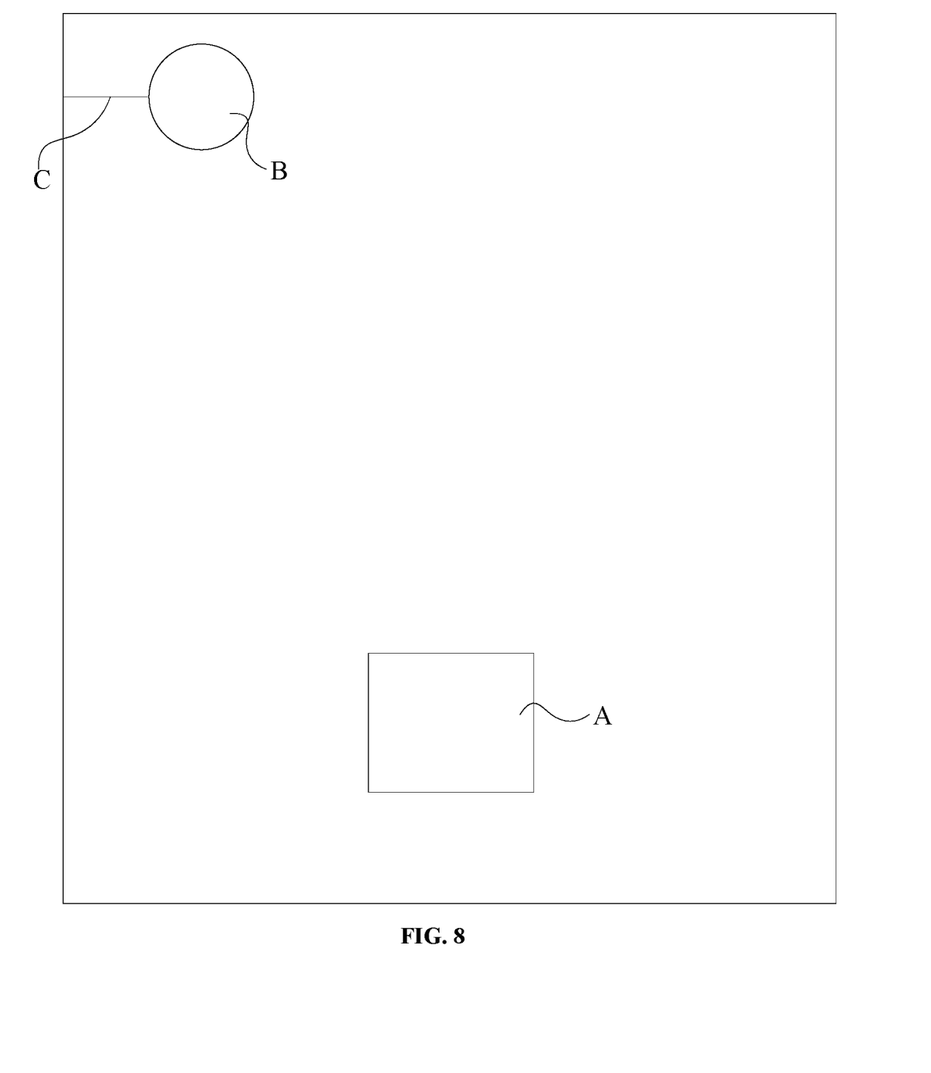
FIG. 8 is another top-view structural schematic diagram of the heat dissipation module according to the embodiments of the present disclosure.

Optionally, in the heat dissipation module according to the embodiments of the present disclosure, as shown in FIGS. 7 and 8, the exhaust passage C can be a cut-off seam between the second windowing area B and the edge of the heat dissipation film 1, i.e., the cut-off seam is manufactured between the second windowing area B and the edge of the heat dissipation film 1 in a half die-cut manner. When no pressure is generated in the second windowing area B and exhausting is not needed, the width of the cut-off seam can be considered to be 0; and when pressure is generated in the second windowing area B and exhausting is needed, gas can be expanded to the cut-off seam to be exhausted along the exhaust passage C.

Specifically, the shorter the exhaust passage C is, the better the exhaust effect is, so that, optionally, in the heat dissipation module according to the embodiments of the present disclosure, as shown in FIGS. 6 and 7, the exhaust passage C can be located between the second windowing area B and the edge of the nearest heat dissipation film 1, and the orthogonal projection of the exhaust passage C on the heat dissipation film 1 is a straight line, which facilitates gas exhausting. Or, the exhaust passage C can also be arranged between the second windowing area B and the edge of the nearer heat dissipation film 1 according to a design requirement, as shown in FIG. 8, without limitation herein.

Based on the same inventive concept, the display device according to the embodiments of the present disclosure, as shown in FIGS. 9-12, includes:

a display panel 100 including a first light-transmitting area 110 and a second light-transmitting area 120 which are arranged on a display area;

a heat dissipation film 200 including grid glue 210, foam 220 and a metal film 230 which are sequentially arranged on the back surface of the display panel 100 in a stacked manner, wherein the heat dissipation film 200 has a first windowing area A penetrating through a thickness direction in the first light-transmitting area 110, a second windowing area B penetrating through the thickness direction in the second light-transmitting area 120, and an exhaust passage C between the second windowing area B and an edge of the heat dissipation film 1;

a first attachment module 300 located on the back surface of the display panel 100 and fixed to the first light-transmitting area 110 through the first windowing area A; and a second attachment module 400 located on the back surface of the display panel 100 and fixed to the second light-transmitting area 120 through the second windowing area B.

Figure 9:
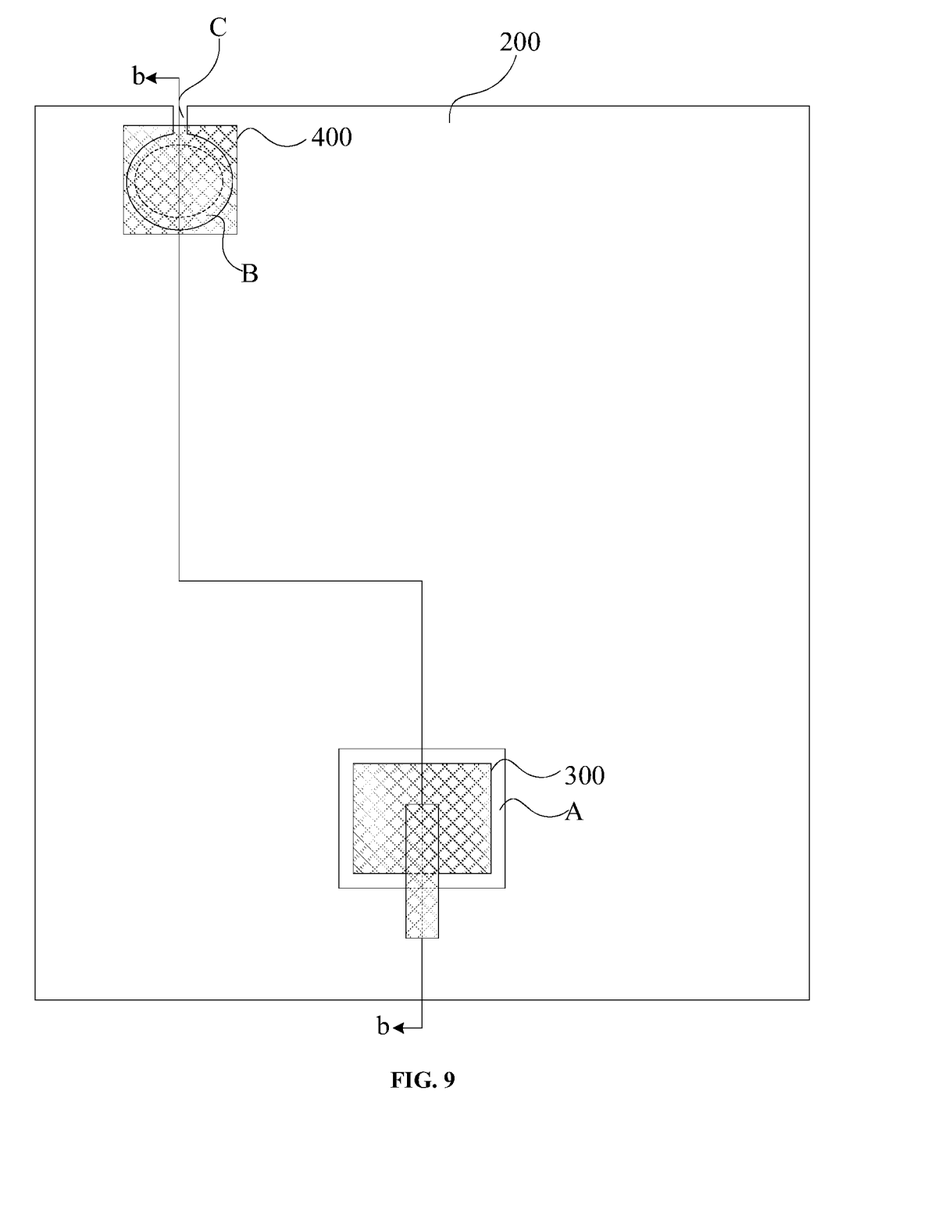
FIG. 9 is a top-view structural schematic diagram of a display device from one side of a heat dissipation film according to the embodiments of the present disclosure.

Optionally, in the display device according to the embodiments of the present disclosure, the display panel 100 can be generally an OLED display panel. The first light-transmitting area 110 and the second light-transmitting area 120 which are arranged in the display area of the display panel each refer to that no shading pattern is arranged on each film layer of the light-transmitting area part in the area, so that light can pass through without being blocked.

Specifically, in the display device according to the embodiments of the present disclosure, the foam 220 is fixed to the back surface of the display panel 100 through the grid glue 210 of the heat dissipation film 200. The foam 220, as a buffer layer, is used for relieving impact of an external force on the display panel 100 during complete machine assembling. The metal film 230, as a main heat dissipation layer, is used for heat dissipation, and is generally made of copper foil. The heat dissipation film 200 can further include other film layers, such as graphite, without limitation herein.

Specifically, the first windowing area A and the second windowing area B which penetrate through the heat dissipation film 200 are respectively arranged correspondingly to the first light-transmitting area A and the second light-transmitting area B, so as to attach corresponding under-screen modules to the back surface of the display panel 100 through different windowing areas. The number of the windowing areas generally corresponds to the number of the under-screen modules which need to be attached, and generally, one windowing area corresponds to one under-screen module. Corresponding windowing areas can be arranged in the heat dissipation film 200 according to the positions and the number of under-screen modules which need to be attached to the back surface of the display panel. A difference between the first windowing area A and the second windowing area B lies in an attaching order of the first attachment module 300 and the second attachment module 400. When the display device is assembled, the first attachment module 300 is attached to the first windowing area A firstly, and then the second attachment module 400 is attached to the second windowing area B. Specifically, the first attachment module 300 can be fixed to the first light-transmitting area 110 through optical glue, and the second attachment module 400 can be fixed to the second light-transmitting area 120 through the optical glue. Optionally, in the display device according to the embodiments of the present disclosure, the first attachment module 300 is generally a fingerprint recognition module, and the second attachment module 400 is generally a camera module. The fingerprint recognition module can be an ultrasonic fingerprint recognition module specifically, so that the first attachment module 300 needs to be attached to the first light-transmitting area 110 in a full-attachment manner.

Because full attachment and defoaming treatment inevitably need to be performed when the fingerprint recognition module 300 is attached to the first windowing area A, and the defoaming treatment needs a certain temperature and pressure, if the second windowing area B is a closed space, thermal expansion and cold contraction of local air may occur, resulting in possible extrusion of the second protective film 5 on the surface into a corresponding position of the display panel, so as to cause breakage or optical stripes and other problems of the display panel. In order to avoid the second windowing area B from forming a sealed space during the defoaming treatment, the exhaust passage C is arranged between the second windowing area B and the edge of the heat dissipation film 200, and hot air formed in the second windowing area B in a defoaming technology can be effectively released to the outside of the heat dissipation module through the exhaust passage C, so that defects of the second windowing area B can be effectively overcome, and increasing the attachment yield is facilitated.

Specifically, when the heat dissipation film 200 in the display device according to the embodiments of the present disclosure is manufactured, after the grid glue 210, the foam 220 and the metal film 230 are sequentially attached to complete manufacturing of the heat dissipation film 200, the first release film can be attached to one side of the grid glue 210 to protect the grid glue 210, and the second release film can be attached to one side of the metal film 230 to protect the metal film 230; and then the first windowing area A and the second windowing area B which penetrate through the heat dissipation film 200 and the second release film are formed on one side of the second release film in a cutting manner and the like, and the exhaust passage C can be formed at the same time.

Figure 10:
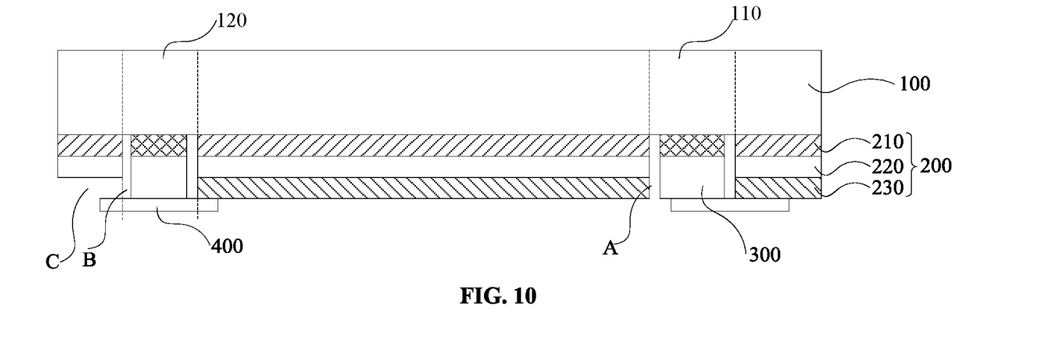
FIG. 10 is a cross-sectional structural schematic diagram along bb in FIG. 9.

Optionally, in the display device according to the embodiments of the present disclosure, based on the manufacturing manner of the heat dissipation film 200, when the exhaust passage C is manufactured on one side of the second release film, as shown in FIG. 10, the exhaust passage C can only penetrate through the metal film 230 of the heat dissipation film 200, i.e., the exhaust passage C is formed only on the metal film 230, and areas of the grid glue 210 and the foam 220 of the heat dissipation film 200 under the exhaust passage C remain intact and are not cut.

Figure 11:
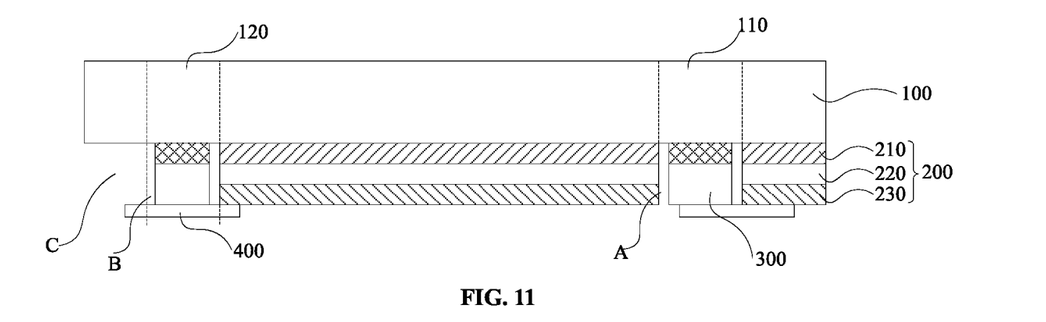
FIG. 11 is another cross-sectional structural schematic diagram along bb in FIG. 9.

Further, optionally, in the display device according to the embodiments of the present disclosure, based on the manufacturing manner of the heat dissipation film 200, when the exhaust passage C is manufactured on one side of the second release film, as shown in FIG. 11, the exhaust passage C can penetrate through the heat dissipation film 200, i.e., areas of the respective film layers of the heat dissipation film 200 in the exhaust passage C are all cut, and only the first release film remains intact.

Figure 12:
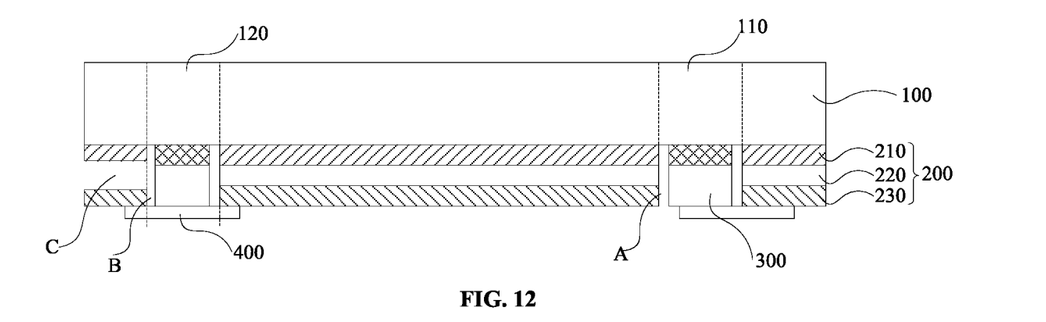
FIG. 12 is another cross-sectional structural schematic diagram along bb in FIG. 9.

Optionally, in the display device according to the embodiments of the present disclosure, based on the manufacturing manner of the heat dissipation film 200, the exhaust passage C can also be manufactured on one side of a side edge of the heat dissipation film 200. That is, as shown in FIG. 12, a passage leading to the second windowing area B can be formed from the side edge of the heat dissipation film 200. For example, as shown in FIG. 12, this passage can get through the film layer where the foam 220 is located to the second windowing area B, and the passage can also get through other adjacent film layers according to the aperture of the passage, without limitation herein.

Specifically, the larger and deeper the aperture of the passage of the exhaust passage C is, the better the exhaust effect is, but the more easily the second windowing area B is influenced by the dirty foreign matters or the strong light and the like through the exhaust passage C, so that when the exhaust passage C is manufactured, film layers and the width occupied by the exhaust passage C can be designed as required to meet the requirements.

Optionally, in the display device according to the embodiments of the present disclosure, as shown in FIG. 6, the exhaust passage C can be an open slot between the second windowing area B and the edge of the heat dissipation film 200, i.e., a trench having a certain width is formed in an orthogonal projection of the heat dissipation film 200 in the cutting manner or the like. Specifically, the width of the exhaust passage C in the direction perpendicular to the extending direction of the exhaust passage C, i.e., the slot width, is generally greater than 0 mm and less than 2 mm.

Optionally, in the display device according to the embodiments of the present disclosure, as shown in FIGS. 7 and 8, the exhaust passage C can be a cut-off seam between the second windowing area B and the edge of the heat dissipation film 200, i.e., the cut-off seam is manufactured between the second windowing area B and the edge of the heat dissipation film 200 in a half die-cut manner. When no pressure is generated in the second windowing area B and exhausting is not needed, the width of the cut-off seam can be considered to be 0; and when pressure is generated in the second windowing area B and exhausting is needed, gas can be expanded to the cut-off seam to be exhausted along the exhaust passage C.

Specifically, the shorter the exhaust passage C is, the better the exhaust effect is, so that, optionally, in the display device according to the embodiments of the present disclosure, as shown in FIGS. 6 and 7, the exhaust passage C can be located between the second windowing area B and the edge of the nearest heat dissipation film 200, the orthogonal projection of the exhaust passage C on the heat dissipation film 200 is a straight line, which facilitates gas exhausting. Or, the exhaust passage C can also be arranged between the second windowing area B and the edge of the nearer heat dissipation film 200 according to a design requirement, as shown in FIG. 8, without limitation herein.

Figure 13:
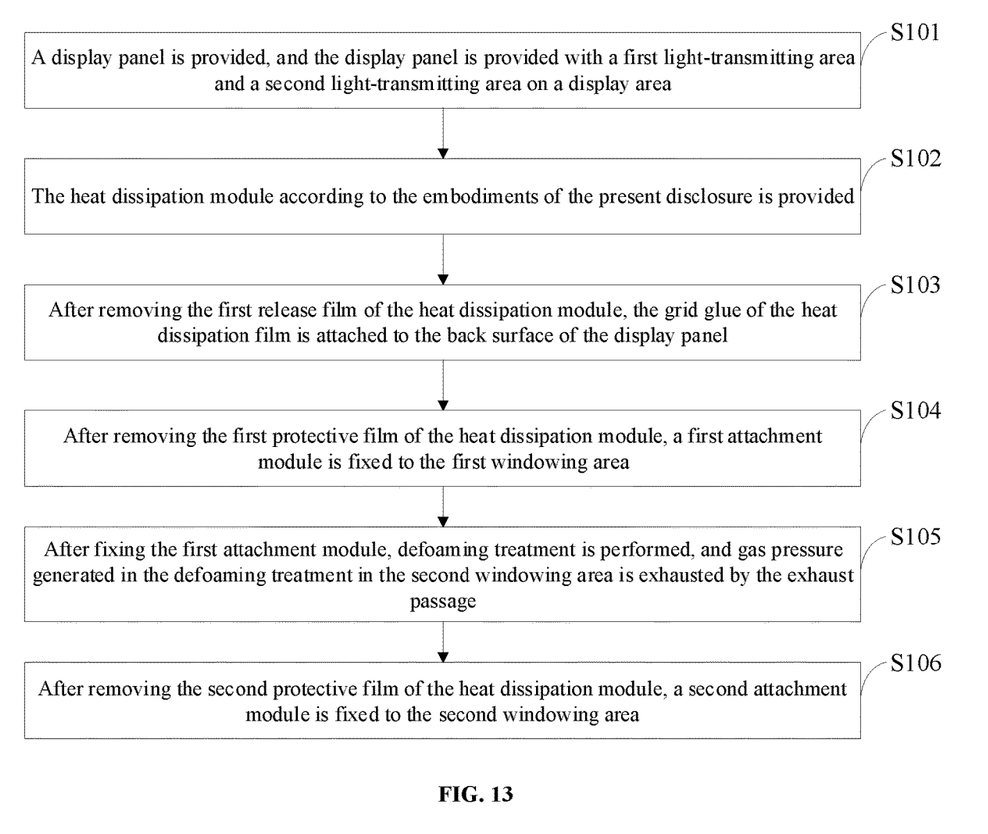
FIG. 13 is a flowchart of an assembling method of the display device according to the embodiments of the present disclosure.

Based on the same inventive concept, an assembling method of the display device according to the embodiments of the present disclosure, as shown in FIG. 13, includes the following steps.

Figure 14:
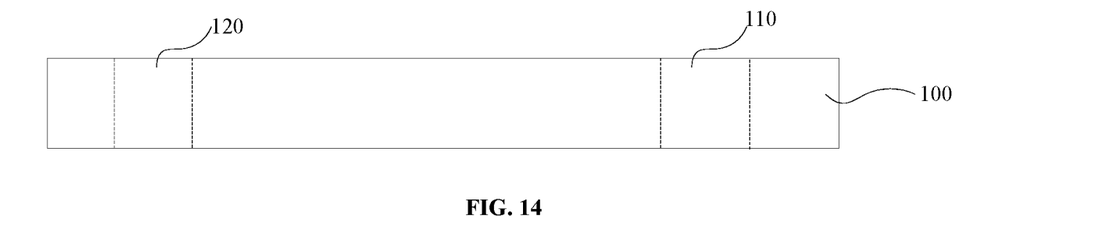
FIG. 14 is a schematic diagram of a display panel provided in the assembling method of the display device according to the embodiments of the present disclosure.

S101, a display panel is provided, and the display panel is provided with a first light-transmitting area and a second light-transmitting area on a display area, as shown in FIG. 14.

S102, the heat dissipation module according to the embodiments of the present disclosure is provided, such as a structure as shown in FIG. 4.

Figure 15:
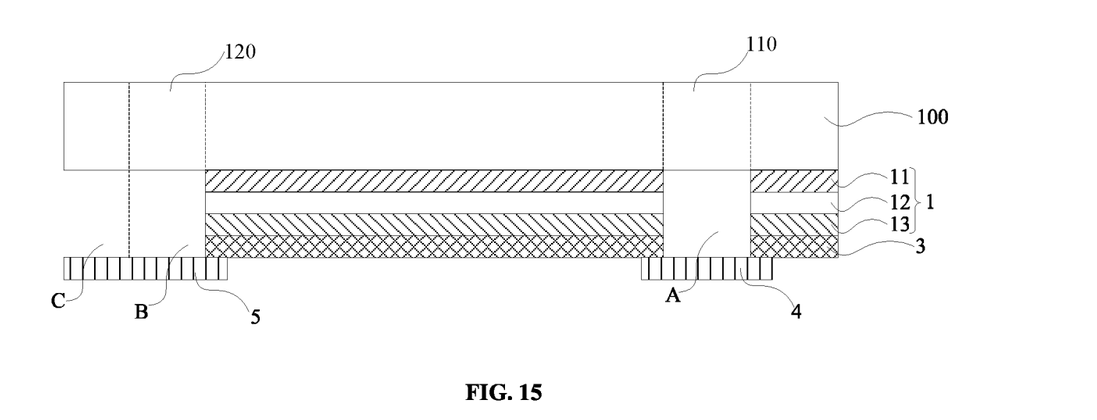
FIG. 15 is a schematic diagram after a heat dissipation film is attached to the back surface of the display panel in the assembling method of the display device according to the embodiments of the present disclosure.

S103, after removing the first release film of the heat dissipation module, the grid glue of the heat dissipation film is attached to the back surface of the display panel, as shown in FIG. 15.

Figure 16:
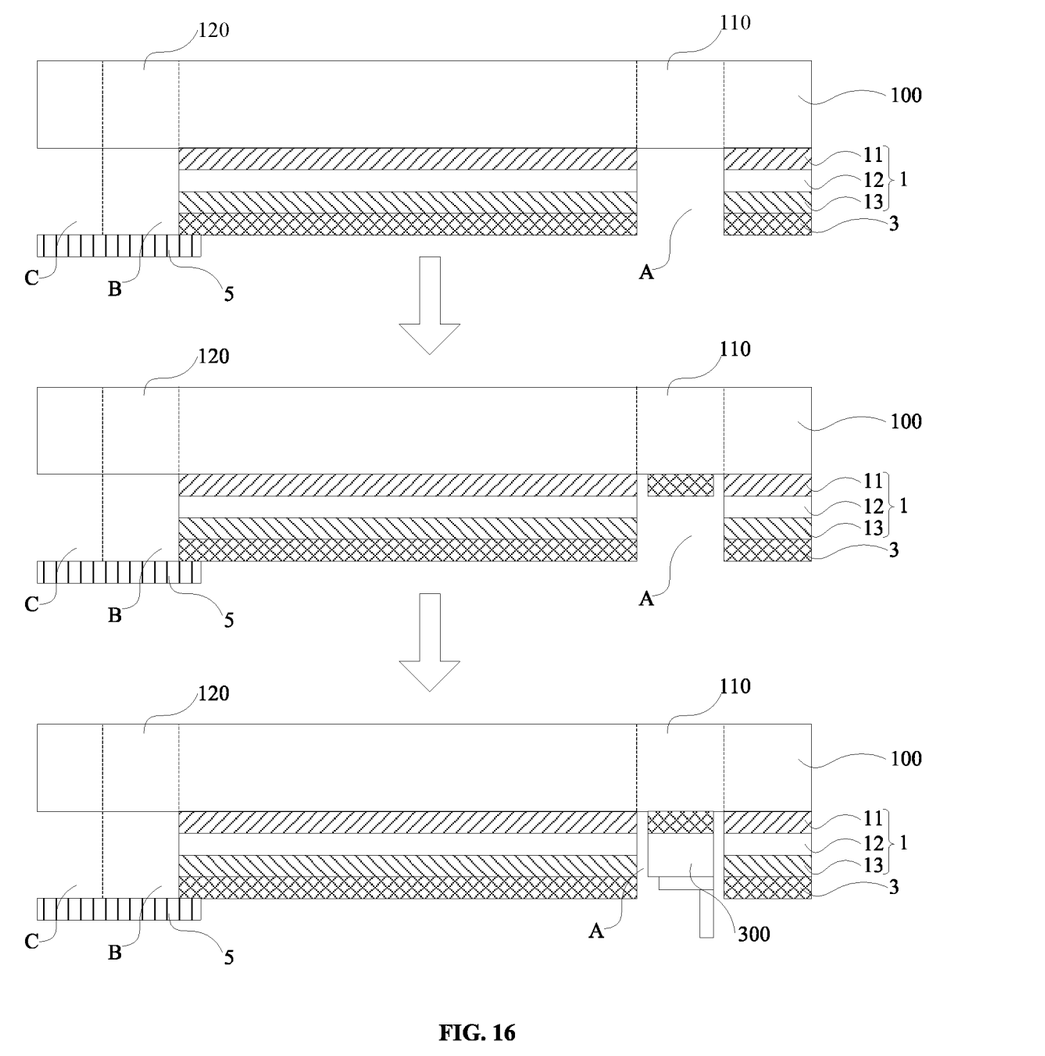
FIG. 16 is a schematic diagram after a first attachment module is attached to the back surface of the display panel in the assembling method of the display device according to the embodiments of the present disclosure.

S104, after removing the first protective film of the heat dissipation module, a first attachment module is fixed to the first windowing area, as shown in FIG. 16, and the first attachment module is generally a fingerprint recognition module.

S105, after fixing the first attachment module, defoaming treatment is performed, and gas pressure generated in the defoaming treatment in the second windowing area is exhausted by the exhaust passage.

Figure 17:
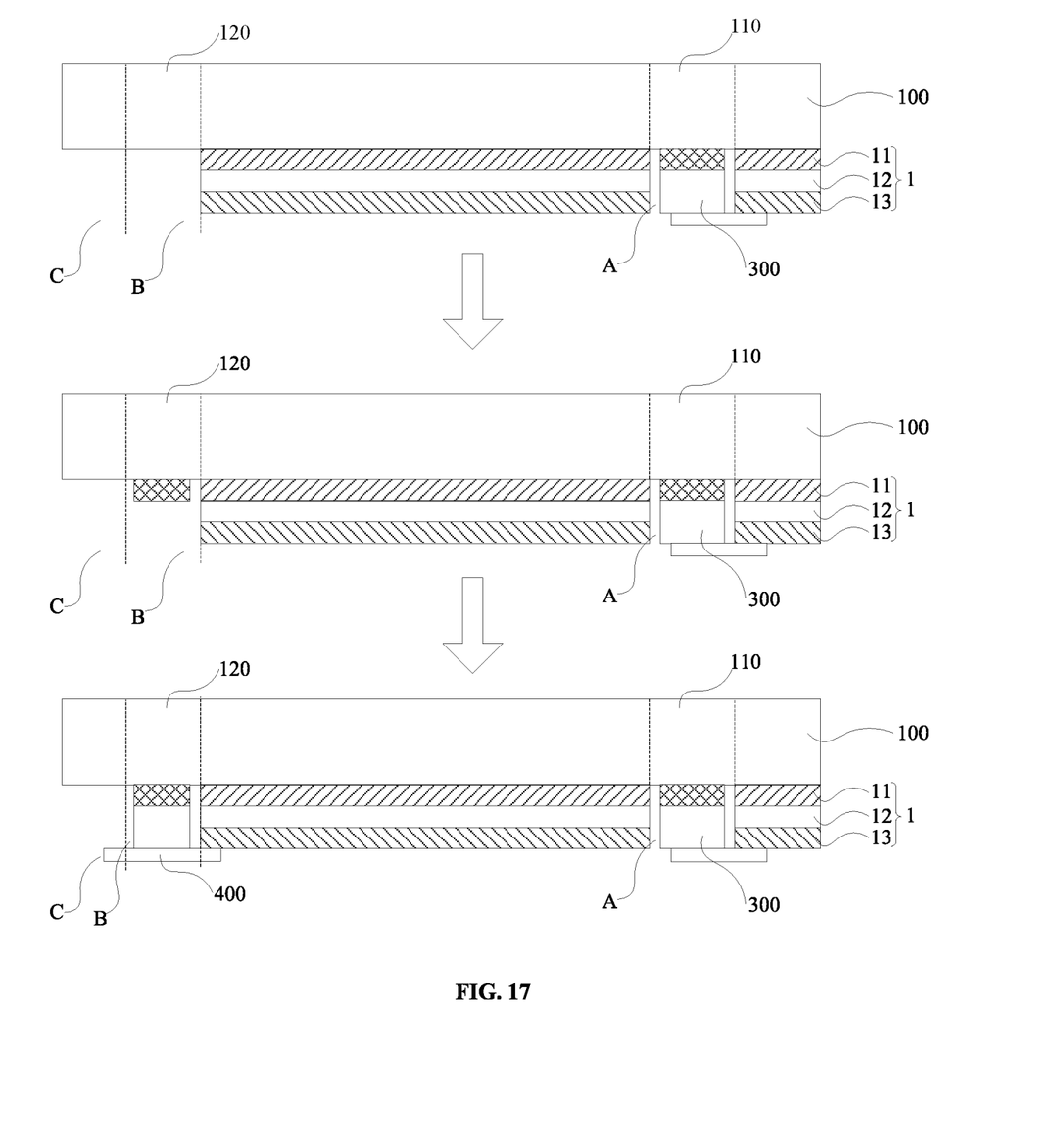
FIG. 17 is a schematic diagram after a second attachment module is attached to the back surface of the display panel in the assembling method of the display device according to the embodiments of the present disclosure.

S106, after removing the second release film and the second protective film of the heat dissipation module, a second attachment module is fixed to the second windowing area, as shown in FIG. 17, and it is worth noting that the second protective film can be removed while the second release film is removed. The second attachment module is generally a camera module.

Specifically, in the assembling method according to the embodiments of the present disclosure, because full attachment and defoaming treatment inevitably need to be performed when the fingerprint recognition module is attached to the first windowing area A, and the defoaming treatment needs a certain temperature and pressure, if the second windowing area B is a closed space, thermal expansion and cold contraction of local air may occur, resulting in possible extrusion of the second protective film on the surface into a corresponding position of the display panel, so as to cause breakage or optical stripes and other problems of the display panel. In order to avoid the second windowing area B from forming a sealed space during the defoaming treatment, the exhaust passage C is arranged between the second windowing area B and the edge of the heat dissipation film, and hot air formed in the second windowing area B in a defoaming technology can be effectively released to the outside of the heat dissipation module through the exhaust passage C, so that defects of the second windowing area B can be effectively overcome, and increasing the attachment yield is facilitated.

It will be apparent to those skilled in the art that various modifications and variations can be made to the present disclosure without departing from the spirit and scope of the present disclosure. In this way, under the condition that these modifications and variations of the present disclosure belong to the scope of the claims of the present disclosure and their equivalent technology, the present disclosure is also intended to include these modifications and variations.

What is claimed is:

1. A heat dissipation module, comprising:
   a heat dissipation film, wherein the heat dissipation film comprises grid glue, foam and a metal film which are arranged in a stacked manner;
   a first release film arranged on one side, facing away from the foam, of the grid glue;
   a second release film arranged on one side, facing away from the foam, of the metal film, wherein the heat dissipation film and the second release film are provided with a first windowing area and a second windowing area which penetrate through a thickness direction, and an exhaust passage is arranged between the second windowing area and an edge of the heat dissipation film;
   a first protective film arranged on one side, facing away from the heat dissipation film, of the second release film, and covering the first windowing area; and
   a second protective film arranged on one side, facing away from the heat dissipation film, of the second release film, and covering the second windowing area and the exhaust passage, wherein the first protective film and the second protective film are independently arranged.

2. The heat dissipation module according to claim 1, wherein the exhaust passage is an open slot or a cut-off seam between the second windowing area and the edge of the heat dissipation film.

3. The heat dissipation module according to claim 1, wherein the exhaust passage is arranged between the second windowing area and the edge of a nearest heat dissipation film, and an orthogonal projection of the exhaust passage on the heat dissipation film is a straight line.

4. The heat dissipation module according to claim 1, wherein the exhaust passage penetrates through the second release film.

5. The heat dissipation module according to claim 4, wherein the exhaust passage penetrates through the metal film of the heat dissipation film.

6. The heat dissipation module according to claim 5, wherein the exhaust passage penetrates through the heat dissipation film.

7. The heat dissipation module according to claim 1, wherein a width of the exhaust passage in a direction perpendicular to an extending direction is less than 2 mm and greater than or equal to 0 mm.

8. An assembling method of a display device, comprising:
   providing a display panel, wherein the display panel has a first light-transmitting area and a second light-transmitting area on a display area;
   providing the heat dissipation module of claim 1;
   after removing the first release film of the heat dissipation module, attaching the grid glue of the heat dissipation film to a back surface of the display panel;
   after removing the first protective film of the heat dissipation module, fixing a first attachment module to the first windowing area;
   after fixing the first attachment module, performing defoaming treatment, and exhausting, by the exhaust passage, gas pressure generated in the defoaming treatment in the second windowing area; and
   after removing the second release film and the second protective film of the heat dissipation module, fixing a second attachment module to the second windowing area.

9. The assembling method according to claim 8, wherein the first attachment module is a fingerprint recognition module and the second attachment module is a camera module.

10. A display device, comprising:
    a display panel, wherein the display panel comprises a first light-transmitting area and a second light-transmitting area which are arranged on a display area;
    a heat dissipation film, wherein the heat dissipation film comprises:
    grid glue, foam and a metal film which are sequentially arranged on a back surface of the display panel in a stacked manner, a first windowing area penetrating through a thickness direction in the first light-transmitting area, a second windowing area penetrating through the thickness direction in the second light-transmitting area, and an exhaust passage between the second windowing area and an edge of the heat dissipation film;

a first attachment module, wherein the first attachment module is arranged on the back surface of the display panel and fixed to the first light-transmitting area through the first windowing area; and a second attachment module, wherein the second attachment module is arranged on the back surface of the display panel and fixed to the second light-transmitting area through the second windowing area.

11. The display device according to claim 10, wherein the exhaust passage is an open slot or a cut-off seam between the second windowing area and the edge of the heat dissipation film.

12. The display device according to claim 10, wherein the exhaust passage is arranged between the second windowing area and the edge of a nearest heat dissipation film, and an orthogonal projection of the exhaust passage on the heat dissipation film is a straight line.

13. The display device according to claim 10, wherein the exhaust passage penetrates through the metal film of the heat dissipation film.

14. The display device according to claim 13, wherein the exhaust passage penetrates through the heat dissipation film.

15. The display device according to claim 10, wherein a width of the exhaust passage in a direction perpendicular to an extending direction is less than 2 mm and greater than or equal to 0 mm.

16. The display device according to claim 10, wherein the first attachment module is a fingerprint recognition module, and the second attachment module is a camera module.

17. The display device according to claim 10, wherein the display panel is an organic light-emitting diode (OLED) display device.

\* \* \* \* \*